(12) United States Patent
Greenwood et al.

(10) Patent No.: US 6,577,012 B1
(45) Date of Patent: Jun. 10, 2003

(54) LASER DEFINED PADS FOR FLIP CHIP ON LEADFRAME PACKAGE

(75) Inventors: Jonathon Gerrit Greenwood, Phoenix, AZ (US); Frank Joseph Juskey, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/929,239

(22) Filed: Aug. 13, 2001

(51) Int. Cl.$^7$ ............................................... H01L 23/48
(52) U.S. Cl. ...................................................... 257/766
(58) Field of Search ................................. 257/666, 673, 257/677, 690, 737, 779, 778, 781, 766

(56) References Cited

U.S. PATENT DOCUMENTS

| | | | |
|---|---|---|---|
| 6,143,981 A | 11/2000 | Glenn | 174/52.4 |
| 6,227,436 B1 | 5/2001 | Nishikawa et al. | 228/180.22 |
| 6,378,758 B1 * | 4/2002 | Haba | 228/108.1 |

* cited by examiner

*Primary Examiner*—David Nelms
*Assistant Examiner*—Quoc Hoang
(74) *Attorney, Agent, or Firm*—Gunnison, McKay & Hodgson, L.L.P.; Serge J. Hodgson (57) ABSTRACT

A leadframe includes a lead. The lead includes a wettable pad and a wettable lead surface. A non wettable barrier separates the wettable pad from the wettable lead surface, the non wettable barrier being formed from a modified portion of the leadframe. Solder wets only the wettable pad during formation of a solder bump between the wettable pad and a bond pad of electronic component flip chip mounted to the leadframe. This results in consistent and reliable solder bump formation. Further, the non wettable barrier is formed in a single automated step with a laser and thus at low cost.

21 Claims, 7 Drawing Sheets

LASER DEFINED PADS FOR FLIP CHIP ON LEADFRAME PACKAGE

BACKGROUND OF THE INVENTION

1. Field of the Invention

The present invention relates generally to the packaging of electronic components. More particularly, the present invention relates to a leadframe and leadframe package.

2. Description of the Related Art

Leadframe packages are well known to those of skill in the art. A leadframe package was fabricated from a leadframe. The leadframe included a plurality of leads. The leadframe further included tiebars, sometimes called dam bars, which held the leads together during fabrication of the leadframe package. Ultimately, the tiebars were trimmed to singulate the leads from one another.

In a standard wirebond leadframe package, the electronic component, sometimes called a die or chip, was attached to a die pad of the leadframe. The bond pads of the electronic component were then electrically connected to the leads of the leadframe by bond wires. The wirebonder, which formed the bond wires, determined the location on the leads to which the bond wires were attached and there was no requirement to define bond pads on the leads.

More recently, flip chip leadframe packages are being formed with electronic components flip chip mounted to leadframes. To form a flip chip leadframe package, the bond pads of the electronic component were bumped, i.e., solder balls were formed on the bond pads of the electronic component.

The electronic component was inverted such that the solder balls were in contact with the leads of the leadframe. The assembly was heated to reflow the solder balls thus forming solder bumps between the bond pads of the electronic component and the leads to the leadframe. The solder bumps, sometimes called bumps or solder joints, supported the electronic component on the leadframe while at the same time formed the electrical connections between the bond pads and the leads of the leadframe.

To form the solder bumps reliably, wettable pads on the leadframe were defined. The wettable pads were solder wettable. During formation of the solder bumps, the solder wet only the wettable pads on the leadframe. This resulted in consistent and reliable solder bump formation. If wettable pads were not defined on the leadframe, the solder would wet the leads uncontrollably, i.e., would run up the leads, resulting in inconsistent formation or failure of the solder bumps.

To form the wettable pads on the leadframe, photoresist was applying over the entire leadframe, the leadframe being formed of a wettable material such as copper. The photoresist was then selectively exposed to ultraviolet radiation thus selectively curing the photoresist. Then cured or uncured photoresist was removed depending upon the type of photoresist used, e.g., negative or positive photoresist, leaving the tips of the leads of the leadframe covered.

The entire leadframe except for the cover tips was plated with a non wettable material such as nickel. The photoresist was then stripped from the tips and the tips defined the wettable pads.

Alternatively, a solder mask was applied, e.g., in a ring, and cured to form a non wettable barrier between the tips of the leads and the remaining leadframe. The tips defined the wettable pads.

As should be readily apparent, using either of the conventional techniques, defining the wettable pads on the leadframe was relatively labor intensive, time-consuming and thus expensive.

SUMMARY OF THE INVENTION

In accordance with one embodiment of the present invention, a leadframe includes a lead. The lead includes a wettable pad and a wettable lead surface. A non wettable barrier separates the wettable pad from the wettable lead surface, the non wettable barrier being formed from a modified portion of the leadframe.

Advantageously, solder wets only the wettable pad during formation of a solder bump between the wettable pad and a bond pad of an electronic component flip chip mounted to the leadframe. This results in consistent and reliable solder bump formation.

In accordance with an alternative embodiment, a method of forming a leadframe includes modifying a wettable region of the leadframe to form a non wettable barrier. A wettable pad is defined with the non wettable barrier.

In one embodiment, the non wettable barrier is formed in a single automated step with a laser. In this manner, the labor intensive, time-consuming, and expensive selective plating or solder mask application to the leadframe of the prior art is eliminated.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1A:
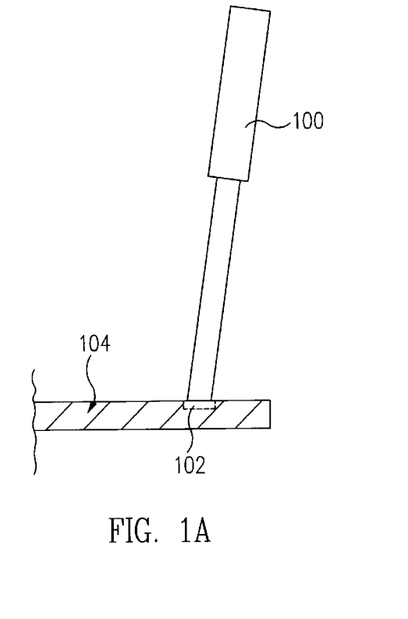
FIG. 1A is a side view of a laser modifying a wettable region of a leadframe in accordance with one embodiment of the present invention.
Figure 1B:
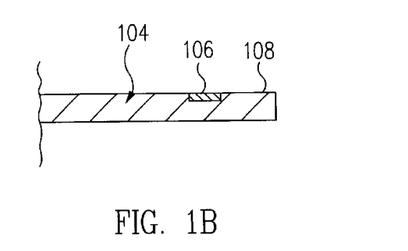
FIG. 1B is a side view of the leadframe of FIG. 1A after modification with the laser in accordance with one embodiment of the present invention.

FIG. 1A is a side view of a laser 100 modifying a wettable region 102 of a leadframe 104 in accordance with one embodiment of the present invention. FIG. 1B is a side view of leadframe 104 after modification with laser 100 in accordance with one embodiment of the present invention.

Referring to FIGS. 1A and 1B together, laser 100 is fired at wettable region 102 of leadframe 104 resulting in the formation of a non wettable barrier 106. More particularly, laser 100 modifies wettable region 102 to be non wettable barrier 106. Although laser 100 is described as performing certain operations, those of skill in the art will recognize that laser 100 is fired, i.e., activated, to produce energy and that this energy produces the physical result.

Non wettable barrier 106 defines a wettable pad 108, sometimes called a flip chip pad, of leadframe 104. In one embodiment, leadframe 104 is formed of a wettable material such as copper. Laser 100 selectively modifies, e.g., oxidized, wettable region 102 of leadframe 104 to form non wettable barrier 106, which defines wettable pad 108.

Figure 2A:
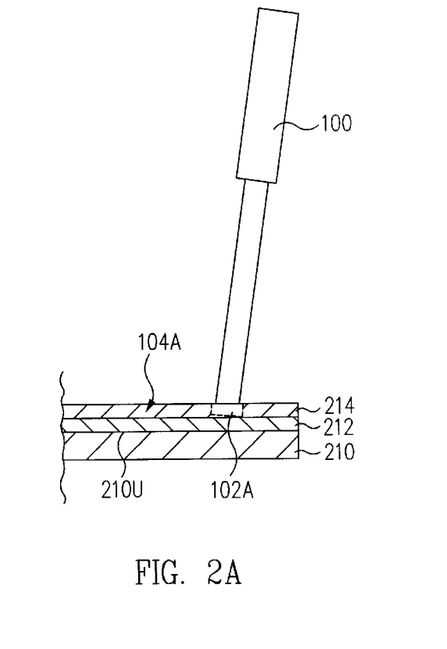
FIG. 2A is a side view of a laser modifying a wettable region of a leadframe in accordance with an alternative embodiment of the present invention.
Figure 2B:
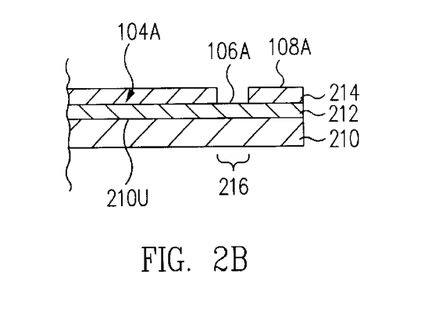
FIG. 2B is a side view of the leadframe of FIG. 2A after modification with the laser in accordance with one embodiment of the present invention.

FIG. 2A is a side view of laser 100 modifying a wettable region 102A of a leadframe 104A in accordance with an alternative embodiment of the present invention. FIG. 2B is a side view of leadframe 104A after modification with laser 100 in accordance with one embodiment of the present invention.

Referring to FIG. 2A, in accordance with this embodiment, leadframe 104A includes a base layer 210, a non wettable layer 212 on base layer 210, and a wettable layer 214 on non wettable layer 212. Advantageously, non wettable layer 212 and wettable layer 214 are formed non selectively, i.e., are not patterned. For example, non wettable layer 212 and wettable layer 214 are formed by a blanket plating. Accordingly, non wettable layer 212 and wettable layer 214 are formed at low cost.

Although leadframe 104A is described and illustrated as including base layer 210 and non wettable layer 212, in an alternative embodiment, base layer 210 and non wettable layer 212 are part of a single non wettable layer. Further, although non wettable layer 212 and wettable layer 214 are illustrated only on an upper, e.g., first, surface 210U of base layer 210, in an alternative embodiment, non wettable layer 212 and wettable layer 214 are formed on all surfaces of base layer 210.

Referring now to FIGS. 2A and 2B together, laser 100 is fired at wettable region 102A of leadframe 104A resulting in the formation of a non wettable barrier 106A. More particularly, laser 100 modifies wettable region 102A to be non wettable barrier 106A. Non wettable barrier 106A defines a wettable pad 108A of leadframe 104A.

In one embodiment, base layer 210 is copper, non wettable layer 212 is nickel, and wettable layer 214 is palladium or gold. Wettable layer 214 includes wettable region 102A. Laser 100 ablates, i.e., removes, wettable region 102A of wettable layer 214 thus exposing a barrier region 216 of non wettable layer 212. Exposed barrier region 216 of non wettable layer 212 forms non wettable barrier 106A.

Advantageously, referring now to FIGS. 1B and 2B together, leadframes 104, 104A include wettable pads 108, 108A, respectively. Solder wets only wettable pads 108, 108A during formation of solder bumps, sometimes called bumps or solder joints. This results in consistent and reliable solder bump formation.

Further, by forming wettable pads 108, 108A with laser 100 (FIGS. 1A, 2A), wettable pads 108, 108A are formed at a minimal cost. More particularly, wettable pads 108, 108A are formed in a single automated step with laser 100 thus eliminating the labor intensive, time-consuming and expensive selective plating or solder mask application to the leadframe of the prior art.

Figure 3:
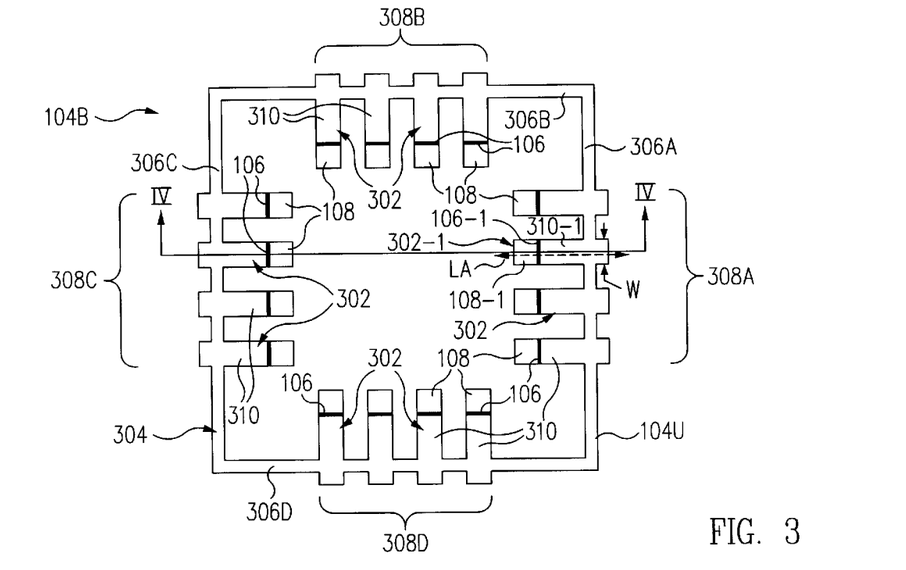
FIG. 3 is a top plan view of a leadframe in accordance with one embodiment of the present invention.

FIG. 3 is a top plan view of a leadframe 104B in accordance with one embodiment of the present invention. Leadframe 104B includes a plurality of leads 302 including a first lead 302-1. Leads 302 are integrally connected together by a leadframe support ring 304, i.e., leadframe 104B is a single piece and not a plurality of separate pieces connected together. Illustratively, leadframe 104B is formed by stamping or etching a piece of electrically conductive material, e.g., a sheet of copper.

In this embodiment, leadframe support ring 304 is rectangular, e.g., square. More particularly, leadframe support ring 304 includes tiebars 306A, 306B, 306C, 306D, each forming a side of leadframe support ring 304.

Tiebars 306A, 306B are parallel to tiebars 306C, 306D, respectively. Further, tiebars 306A, 306C are connected to and extend between tiebar 306B and tiebar 306D. Similarly, tiebars 306B, 306D, are connected to and extend between tiebar 306A and tiebar 306C. Tiebars 306A, 306B, 306C, 306D are collectively referred to as tiebars 306.

As shown in FIG. 3, a first set 308A of leads 302 is connected together and supported by tiebar 306A. More particularly, set 308A includes four leads 302. However, in other embodiments, set 308A includes more or less than four leads 302.

Leads 302 of set 308A extend perpendicularly inwards from tiebar 306A. Tiebars 306B, 306C, 306D connect together and support sets 308B, 308C, 308D of leads 302, respectively, in a similar manner and so are not discussed further to avoid detracting from the principals of the invention. Sets 308A, 308B, 308C, 308D are collectively referred to as sets 308.

Although tiebars 306 connect together and support sets 308 of leads 302, in an alternative embodiment, one or more of tiebars 306 is formed without having an associated set 308 of leads 302. For example, tiebar 306B and tiebar 306D are formed without set 308B and set 308D of leads 302, respectively.

Set 308A of leads 302 includes lead 302-1. Lead 302-1 has a longitudinal axis LA running along the length of lead 302-1. In this embodiment, longitudinal axis LA is perpendicular to tiebar 306A.

Lead 302-1 also has a width W perpendicular to longitudinal axis LA. The other leads 302 are similar to lead 302-1 and so are not discussed further to avoid detracting from the principals of the invention.

Figure 4A:
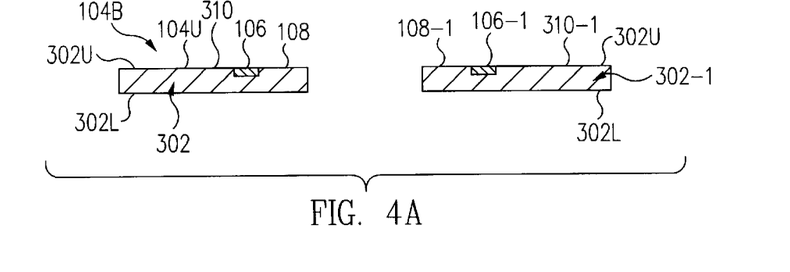
FIG. 4A is a cross-sectional view of the leadframe along the line IV—IV of FIG. 3 in accordance with one embodiment of the present invention.

FIG. 4A is a cross-sectional view of leadframe 104B along the line IV—IV of FIG. 3 in accordance with one embodiment of the present invention. Referring now to FIGS. 3 and 4A together, leads 302 include wettable pads 108. Wettable pads 108 are wettable, sometimes called solder wettable, i.e., have the ability to be wet with molten solder. As used herein, solder includes tin/lead alloy and more generally any alloy or electrically conductive material that has the ability to reflow, i.e., melt, flow and resolidify, to form bumps 506 (FIG. 5) as discussed further below.

Wettable pads 108 are defined by non wettable barriers 106. More particularly, wettable pads 108 are separated from wettable lead surfaces 310 by non wettable barriers 106. Wettable lead surfaces 310 are wettable. In contrast to wettable pads 108 and wettable lead surfaces 310, non wettable barriers 106 are not wettable, i.e., do not have the ability to be wet with molten solder. Stated another way, non wettable barriers 106 repel molten solder. Generally, wettable pads 108 and wettable lead surfaces 310 have a greater wetability than non wettable barriers 106.

To illustrate, lead 302-1 includes a first wettable pad 108-1 of the plurality of wettable pads 108. Wettable pad 108-1 is defined by a first non wettable barrier 106-1 of the plurality of non wettable barriers 106.

More particularly, wettable pad 108-1 is separated from a first wettable lead surface 310-1 of the plurality of wettable lead surfaces 310 by non wettable barrier 106-1. The other leads 302 include wettable pads 108, non wettable barriers 106, and wettable lead surfaces 310 in a similar manner and so are not discussed further to avoid detracting from the principals of the invention.

As best shown in FIG. 4A, lead 302-1 includes an upper, e.g., first, surface 302U and a lower, e.g., second, surface 302L. Non wettable barrier 106-1, wettable pad 108-1, and wettable lead surface 310-1 are regions of upper surface 302U of lead 302-1.

In accordance with this embodiment, non wettable barrier 106-1 is a straight line on upper surface 302U running entirely across width W and perpendicular to longitudinal axis LA of lead 302-1. Non wettable barrier 106-1, i.e., a first region of upper surface 302U of lead 302-1, separates wettable pad 108-1, i.e., a second region of upper surface 302U of lead 302-1, from wettable lead surface 310-1, i.e., a third region of upper surface 302U of lead 302-1.

Although non wettable barrier 106-1 is illustrated as a straight line, in alternative embodiments, non wettable barrier 106-1 is curved or includes a plurality of straight segments connected together. Stated another way, instead of being rectangular, in alternative embodiments, wettable pad 108-1 is circular, oval or another shape.

In one embodiment, leadframe 104B is a copper leadframe. In accordance with this embodiment, wettable pad 108-1 and wettable lead surface 310-1 are copper and non wettable barrier 106-1 is oxidized copper. Since copper has a greater wetability than oxidized copper, wettable pad 108-1, which is copper, has a greater wetability than non wettable barrier 106-1, which is oxidized copper. Advantageously, as discussed further below, non wettable barrier 106-1 prevents solder from running on to wettable lead surface 310-1.

Referring to FIGS. 1A, 1B, 3 and 4A together, non wettable barriers 106 are formed using laser 100. More particularly, laser 100 is fired at upper surfaces 302U of leads 302, and, more generally, at an upper, e.g., first, surface 104U of leadframe 104B.

Laser 100 is fired in an oxygen-containing environment, e.g., in air. Laser 100 selectively heats leads 302, and, more generally, leadframe 104B. More particularly, laser 100 selectively heats wettable regions of leadframe 104B. The heated copper of leads 302 and, more particularly, wettable regions 102, reacts with the oxygen in the air to form oxidized copper, this oxidized copper forming non wettable barriers 106.

Figure 4B:
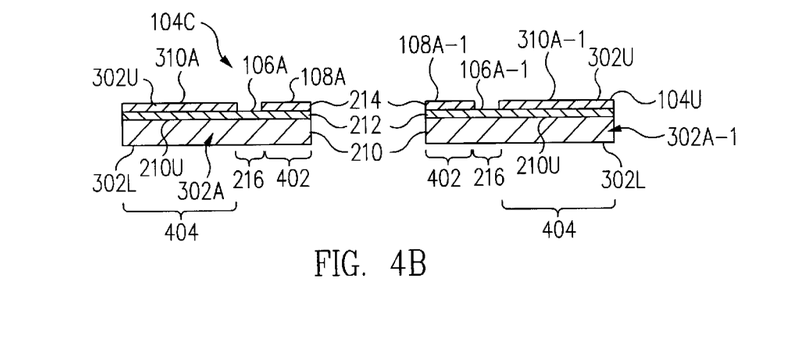
FIG. 4B is a cross-sectional view of a leadframe in accordance with an alternative embodiment of the present invention.

FIG. 4B is a cross-sectional view of a leadframe 104C in accordance with an alternative embodiment of the present invention. Leadframe 104C of FIG. 4B is similar to leadframe 104B of FIGS. 3 and 4A and only the significant differences are discussed below.

Referring now to FIG. 4B, leadframe 104C including leads 302A are formed from a base layer 210, a non wettable layer 212 on base layer 210, and a wettable layer 214 on non wettable layer 212. As should be readily apparent, non wettable layer 212 is not wettable and wettable layer 214 is wettable.

Although leadframe 104C is described and illustrated as including base layer 210 and non wettable layer 212, in an alternative embodiment, base layer 210 and non wettable layer 212 are part of a single non wettable layer. Further, although non wettable layer 212 and wettable layer 214 are illustrated only on an upper, e.g., first, surface 210U of base layer 210, in an alternative embodiment, non wettable layer 212 and wettable layer 214 are formed on all surfaces of base layer 210.

Leads 302A include non wettable barriers 106A, wettable pads 108A and wettable lead surfaces 310A. To illustrate, referring now to a first lead 302A-1 of the plurality of leads 302A, upper surface 302U of lead 302A-1 includes a first non wettable barrier 106A-1 of the plurality of non wettable barriers 106A. Non wettable barrier 106A-1 defines a first wettable pad 108A-1 of the plurality of wettable pads 108A.

A first wettable lead surface 310A-1 of the plurality of wettable lead surfaces 310A is separated from wettable pad 108A-1 by non wettable barrier 106A-1. The other leads 302A include non wettable barriers 106A, wettable pads 108A and wettable lead surfaces 310A in a similar manner and so are not discussed further to avoid detracting from the principals of the invention.

More particularly, an exposed barrier region 216 of non wettable layer 212 defines non wettable barrier 106A-1 of lead 302A-1. Exposed barrier region 216 of non wettable layer 212 separates a tip region 402 of wettable layer 214 from a remainder region 404 of wettable layer 214. Tip region 402 defines wettable pad 108A-1 and remainder region 404 defines wettable lead surface 310A-1.

In one embodiment, base layer 210 is copper, non wettable layer 212 is nickel, and wettable layer 214 is palladium or gold. In accordance with this embodiment, wettable pad 108A-1 and wettable lead surface 310A-1 are palladium or gold while non wettable barrier 106A-1 is nickel.

Since palladium and gold have a greater wetability than nickel, wettable pad 108A-1, which is palladium or gold, has a greater wetability than non wettable barrier 106A-1, which is nickel. Advantageously, as discussed further below, non wettable barrier 106A-1 prevents solder from running on to wettable lead surface 310A-1.

To form leadframe 104C, non wettable layer 212 is formed non selectively on base layer 210. Wettable layer 214 is formed non selectively on non wettable layer 212. Since non wettable layer 212 and wettable layer 214 are formed non selectively, i.e., are not patterned, non wettable layer 212 and wettable layer 214 are formed at minimal cost.

Referring to FIGS. 2A, 2B and 4B together, non wettable barriers 106A are formed using laser 100. More particularly, laser 100 is fired at upper surfaces 302U of leads 302, and, more generally, at an upper, e.g., first, surface 104U of leadframe 104C. Laser 100 selectively ablates leads 302, and, more particularly, ablates wettable regions 102A. Removal of wettable regions 102A exposes barrier regions 216 of non wettable layer 212, these exposed barrier region 216 forming non wettable barriers 106A.

Figure 5:
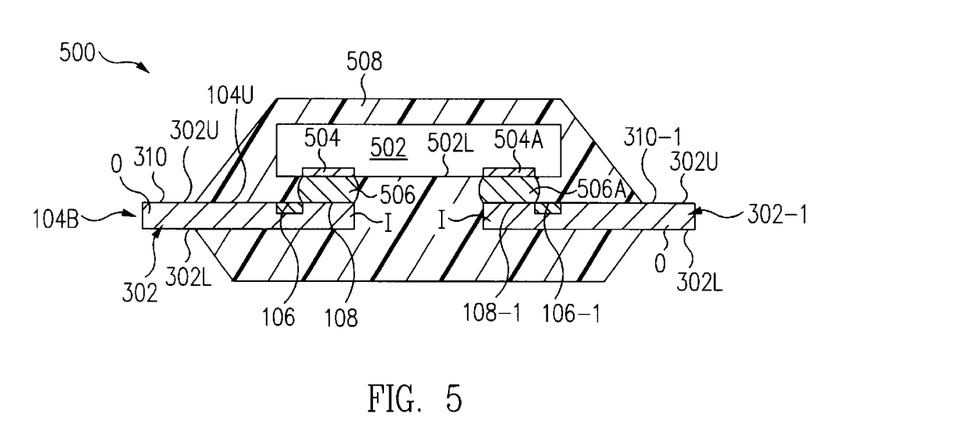
FIG. 5 is a cross-sectional view of a leadframe package formed with the leadframe of FIGS. 3 and 4A in accordance with one embodiment of the present invention.

FIG. 5 is a cross-sectional view of a leadframe package 500 formed with leadframe 104B of FIGS. 3 and 4A in accordance with one embodiment of the present invention. Leadframe package 500 includes an electronic component 502, sometimes called a chip or die. Electronic component 502 includes a plurality of bond pads 504 on a lower, e.g., first, surface 502L of electronic component 502. Bond pads 504 are electrically and physically connected to wettable pads 108 of leadframe 104B by bumps 506, e.g., formed of solder. Bumps 506 are sometimes called solder joints or solder bumps.

To illustrate, a first bond pad 504A of the plurality of bond pads 504 is electrically and physically connected to wettable pad 108-1 by a first bump 506A of the plurality of bumps 506. The other bond pads 504 are electrically and physically connected to the other wettable pads 108 by the other bumps 506 in a similar manner and so are not discussed further to avoid detracting from the principals of the invention.

Advantageously, non wettable barriers 106 prevent bumps 506 from running on to and contacting wettable lead surfaces 310. Stated another way, non wettable barriers 106 insure that bumps 506 only contact wettable pads 108. In this manner, bumps 506 are formed with a repeatable height, shorting of leads 302 is prevented, and formation of an open circuit between leads 302 and bond pads 504 is prevented.

Leadframe package 500 further includes a package body 508, e.g., encapsulant. Package body 508 encloses electronic component 502, bumps 506, and inner ends I of leads 302 including wettable pads 108. Outer ends O of leads 302 protrude from package body 508.

Figure 6:
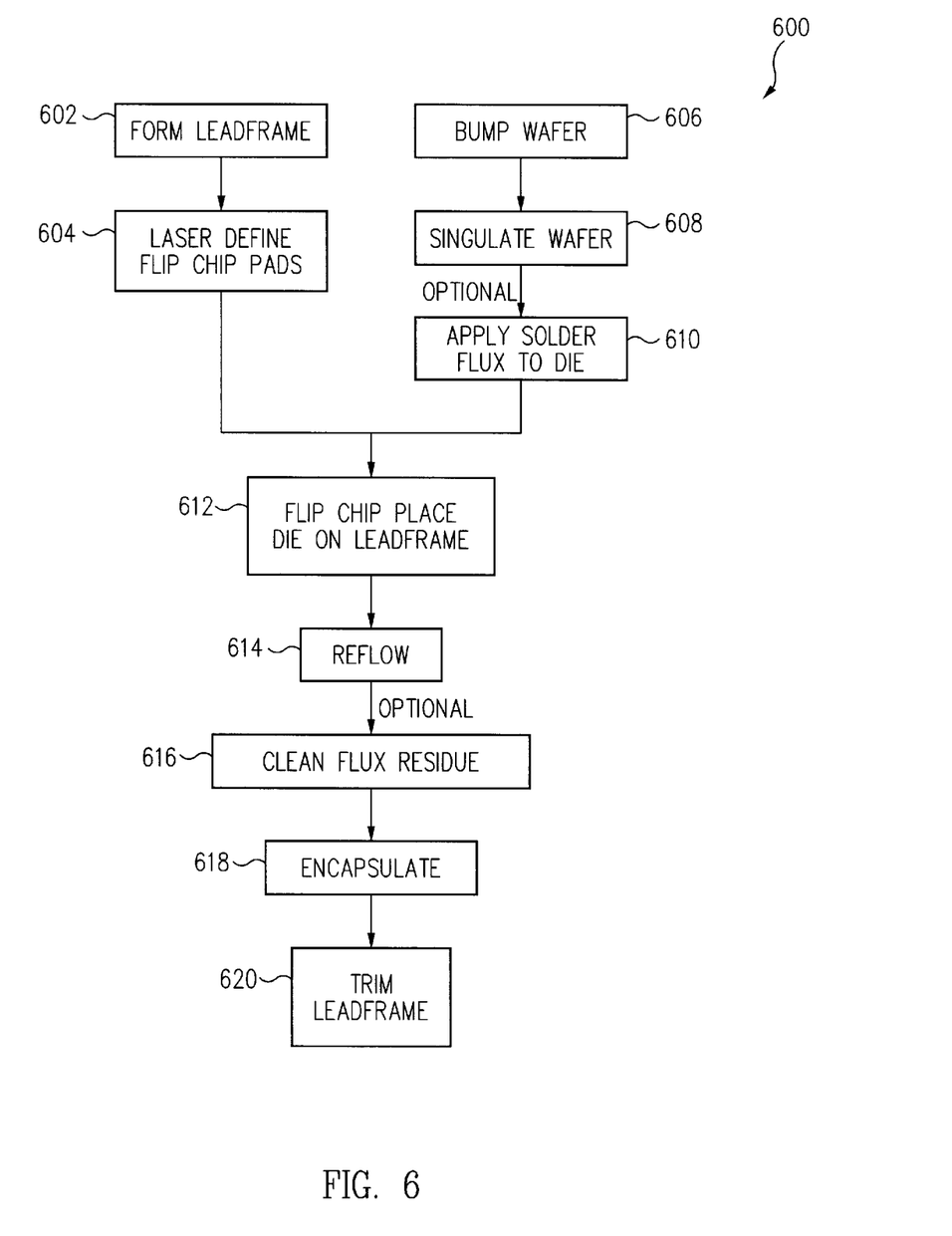
FIG. 6 is a block diagram illustrating operations in a process for manufacturing the leadframe package of FIG. 5 in accordance with one embodiment of the present invention.

FIG. 6 is a block diagram 600 illustrating operations in a process for manufacturing leadframe package 500 of FIG. 5 in accordance with one embodiment of the present invention. Referring now to FIGS. 5 and 6 together, in a Form Leadframe Operation 602, leadframe 104B is formed. Illustratively, leadframe 104B is formed by etching or stamping an electrically conductive material, e.g., a sheet of copper. In a Laser Define Flip Chip Pads Operation 604, wettable pads 108, sometimes called flip chip pads, are defined with a laser as described above.

In a Bump Wafer Operation 606, solder balls are formed on the bond pads of dies, i.e., electronic components 502, while still in wafer form. The wafer is then singulated in a Singulate Wafer Operation 608. Optionally, solder flux is applied to the solder balls in an Apply Solder Flux to Die Operation 610. Operations 606, 608 and 610 are well known to those of skill in the art and so are not discussed in detail to avoid detracting from the principals of the invention.

Electronic component 502 is then flip chip placed on leadframe 104B such that the solder balls (not shown) on bond pads 504 are in abutting contact with wettable pads 108 in a Flip Chip Place Die on Leadframe Operation 612. The assembly is then heated to reflow the solder balls and form bumps 506 in a Reflow Operation 614. Advantageously, bumps 506 are confined to wettable pads 108 by non wettable barriers 106 and do not run up wettable lead surfaces 310 during Reflow Operation 614.

In an optional Clean Flux Residue Operation 616, any solder flux generated during Reflow Operation 614 is removed. Package body 508 is then formed, e.g., by transferring molding, in an Encapsulate Operation 618. Leadframe 104B is then trimmed to singulated leads 302 in a Trim Leadframe Operation 620 and to complete the fabrication of package 500. Illustratively, tiebars 306 (not shown, see FIG. 3) are trimmed during Trim Leadframe Operation 620.

Figure 7:
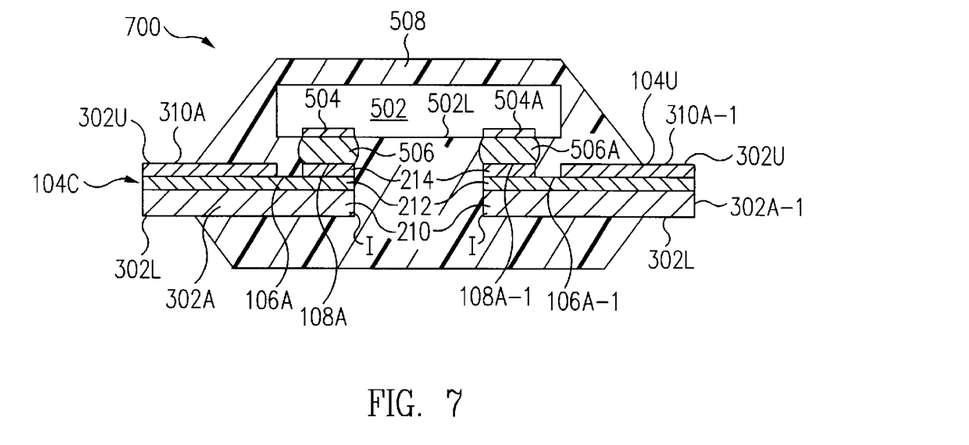
FIG. 7 is a cross-sectional view of a leadframe package formed with the leadframe of FIG. 4B in accordance with an alternative embodiment of the present invention.

FIG. 7 is a cross-sectional view of a leadframe package 700 formed with leadframe 104C of FIG. 4B in accordance with an alternative embodiment of the present invention. Leadframe package 700 of FIG. 7 is similar to leadframe package 500 of FIG. 5 and only the significant differences are discussed below.

Referring now to FIG. 7, bond pads 504 are electrically and physically connected to wettable pads 108A of leadframe 104C by bumps 506, e.g., formed of solder. To illustrate, bond pad 504A is electrically and physically connected to wettable pad 108A-1 by bump 506A. The other bond pads 504 are electrically and physically connected to the other wettable pads 108A by the other bumps 506 in a similar manner and so are not discussed further to avoid detracting from the principals of the invention.

Advantageously, non wettable barriers 106A prevent bumps 506 from running on to wettable lead surfaces 310A. Stated another way, non wettable barriers 106A insure that bumps 506 only contact wettable pads 108A. In this manner, bumps 506 are formed with a repeatable height, shorting of leads 302 and/or formation of an open circuit between leads 302 and bond pads 504 is prevented.

Figure 8:
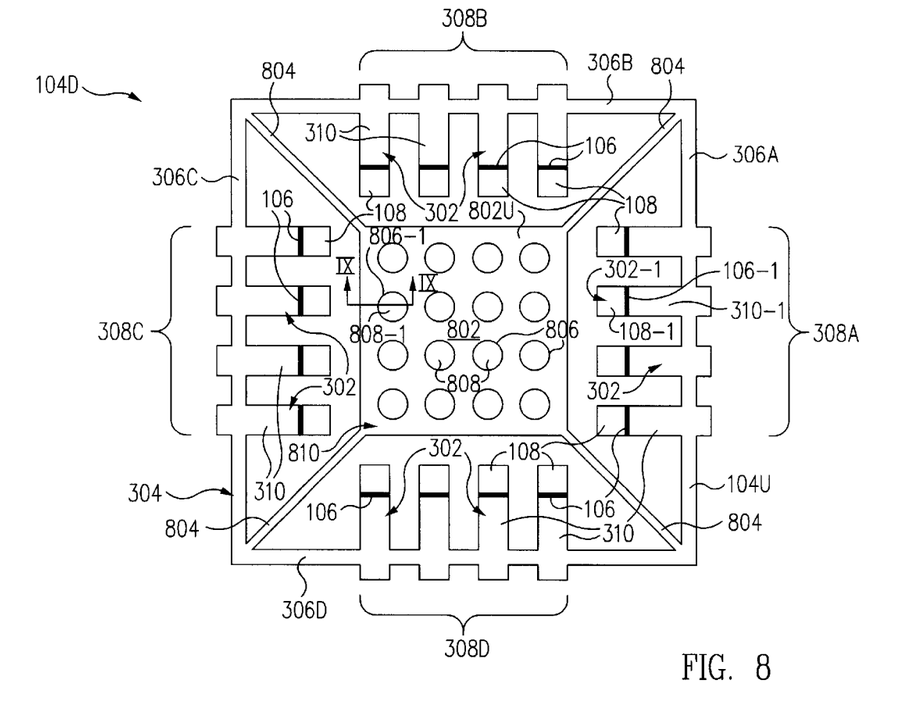
FIG. 8 is a top plan view of a leadframe in accordance with another embodiment of the present invention.

FIG. 8 is a top plan view of a leadframe 104D in accordance with another embodiment of the present invention. Leadframe 104D of FIG. 8 is similar to leadframe 104B of FIG. 3 and only the significant differences are discussed below.

Referring now to FIG. 8, leadframe 104D includes a ground paddle 802, sometimes called a ground pad. Ground paddle 802 is connected to leadframe support ring 304 by ground paddle support bars 804, sometimes called tiebars. Illustratively, ground paddle 802 is rectangular, e.g., square, and a ground paddle support bar 804 connects each corner of ground paddle 802 to leadframe support ring 304. In one embodiment, leadframe 104D is integral, for example, is formed by stamping or etching a single copper sheet.

Figure 9A:
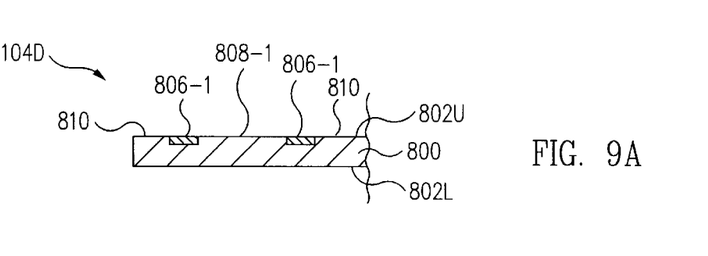
FIG. 9A is a cross-sectional view of a ground paddle of the leadframe along the line IX—IX of FIG. 8 in accordance with one embodiment of the present invention.

FIG. 9A is a cross-sectional view of ground paddle 802 of leadframe 104D along the line IX—IX of FIG. 8 in accordance with one embodiment of the present invention. Referring now to FIGS. 8 and 9A together, ground paddle 802 includes wettable ground pads 808. Wettable ground pads 808 are wettable.

Wettable ground pads 808 are defined by non wettable barriers 806. More particularly, wettable ground pads 808 are separated from wettable ground paddle surface 810 by non wettable barriers 806. Wettable ground paddle surface 810 is wettable. In contrast to wettable ground pads 808 and wettable ground paddle surface 810, non wettable barriers 806 are not wettable. Generally, wettable ground pads 808 and wettable ground paddle surface 810 have a greater wetability than non wettable barriers 806.

To illustrate, ground paddle 802 includes a first wettable ground pad 808-1 of the plurality of wettable ground pads 808. Wettable ground pad 808-1 is defined by a first non wettable barrier 806-1 of the plurality of non wettable barriers 806. More particularly, wettable ground pad 808-1 is separated from wettable ground paddle surface 810 by non wettable barrier 806-1. The other wettable ground pads 808 and non wettable barriers 806 are similar and so are not discussed further to avoid detracting from the principals of the invention.

As best shown in FIG. 9A, ground paddle 802 includes an upper, e.g., first, surface 802U and a lower, e.g., second, surface 802L. Non wettable barriers 806, wettable ground pads 808, and wettable ground paddle surface 810 are regions of upper surface 802U.

In accordance with this embodiment, non wettable barrier 806-1 is a circle on upper surface 802U. Non wettable barrier 806-1, i.e., a first region of upper surface 802U, separates wettable ground pad 808-1, i.e., a second region of upper surface 802U, from wettable ground paddle surface 810, i.e., a third region of upper surface 802U.

Although non wettable barrier 806-1 is illustrated as a circle, in alternative embodiments, non wettable barrier 806-1 is oval, curved or includes a plurality of straight segments connected together. Stated another way, instead of being circular, in alternative embodiments, wettable ground pad 808-1 is rectangular, oval or another shape.

In one embodiment, leadframe 104D is a copper leadframe. In accordance with this embodiment, wettable ground pads 808 and wettable ground paddle surface 810 are copper and non wettable barriers 806 are oxidized copper. Since copper has a greater wetability than oxidized copper, wettable ground pads 808, which are copper, have a greater wetability than non wettable barriers 806, which are oxidized copper. Advantageously, as discussed further below, non wettable barriers 806 prevents solder from running on to wettable ground paddle surface 810. Illustratively, wettable ground pads 808 and non wettable barriers 806 are formed by modifying portions of ground paddle 802 with a laser in a manner similar to that discussed above with regards to wettable pads 108 and non wettable barriers 106 of leadframe 104B (FIGS. 3, 4A).

Figure 9B:
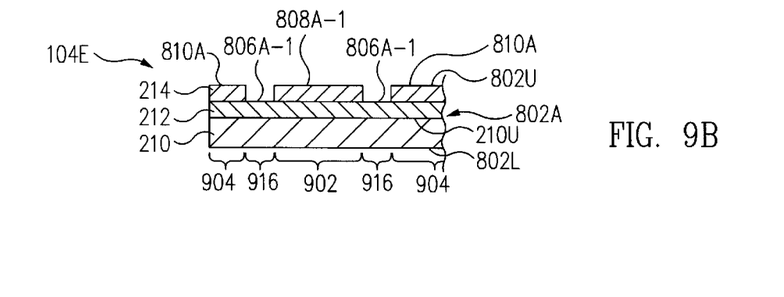
FIG. 9B is a cross-sectional view of a ground paddle of a leadframe in accordance with an alternative embodiment of the present invention.

FIG. 9B is a cross-sectional view of a ground paddle 802A of a leadframe 104E in accordance with an alternative embodiment of the present invention. Leadframe 104E of FIG. 9B is similar to leadframe 104D of FIGS. 8 and 9A and only the significant differences are discussed below.

Referring now to FIG. 9B, ground paddle 802A is formed from a base layer 210, a non wettable layer 212 on base layer 210, and a wettable layer 214 on non wettable layer 212. As should be readily apparent, non wettable layer 212 is not wettable and wettable layer 214 is wettable.

Although ground paddle 802A is described and illustrated as including base layer 210 and non wettable layer 212, in an alternative embodiment, base layer 210 and non wettable layer 212 are part of a single non wettable layer. Further, although non wettable layer 212 and wettable layer 214 are illustrated only on an upper, e.g., first, surface 210U of base layer 210, in an alternative embodiment, non wettable layer 212 and wettable layer 214 are formed on all surfaces of base layer 210.

Ground paddle 802A includes a non wettable barrier 806A-1, a wettable ground pad 808A-1 and a wettable ground paddle surface 810A. Non wettable barrier 806A-1 defines wettable ground pad 808A-1, which is one of a plurality of wettable ground pads of ground paddle 802A.

Wettable ground paddle surface 810A is separated from wettable ground pad 808A-1 by non wettable barrier 806A-1. More particularly, exposed barrier region 916 of non wettable layer 212 defines non wettable barrier 806A-1 of ground paddle 802A. Exposed barrier region 916 of non wettable layer 212 separate a ground pad region 902 of wettable layer 214 from a remainder region 904 of wettable layer 214. Ground pad region 902 defines wettable ground pad 808A-1 and remainder region 904 defines wettable ground paddle surface 810A.

In one embodiment, base layer 210 is copper, non wettable layer 212 is nickel, and wettable layer 214 is palladium or gold. In accordance with this embodiment, wettable ground pad 808A-1 and wettable ground paddle surface 810A are palladium or gold while non wettable barrier 806A-1 is nickel.

Since palladium and gold have a greater wetability than nickel, wettable ground pad 808A-1, which is palladium or gold, has a greater wetability than non wettable barrier 806A-1, which is nickel. Advantageously, as discussed further below, non wettable barrier 80GA-1 prevents solder from running on to wettable ground paddle surface 810A.

Illustratively, wettable ground pad 808A-1 and non wettable barrier 806A-1 are formed in a manner similar to that discussed above with regards to wettable pads 108A and non wettable barriers 106A of leadframe 104C (FIG. 4B).

Figure 10:
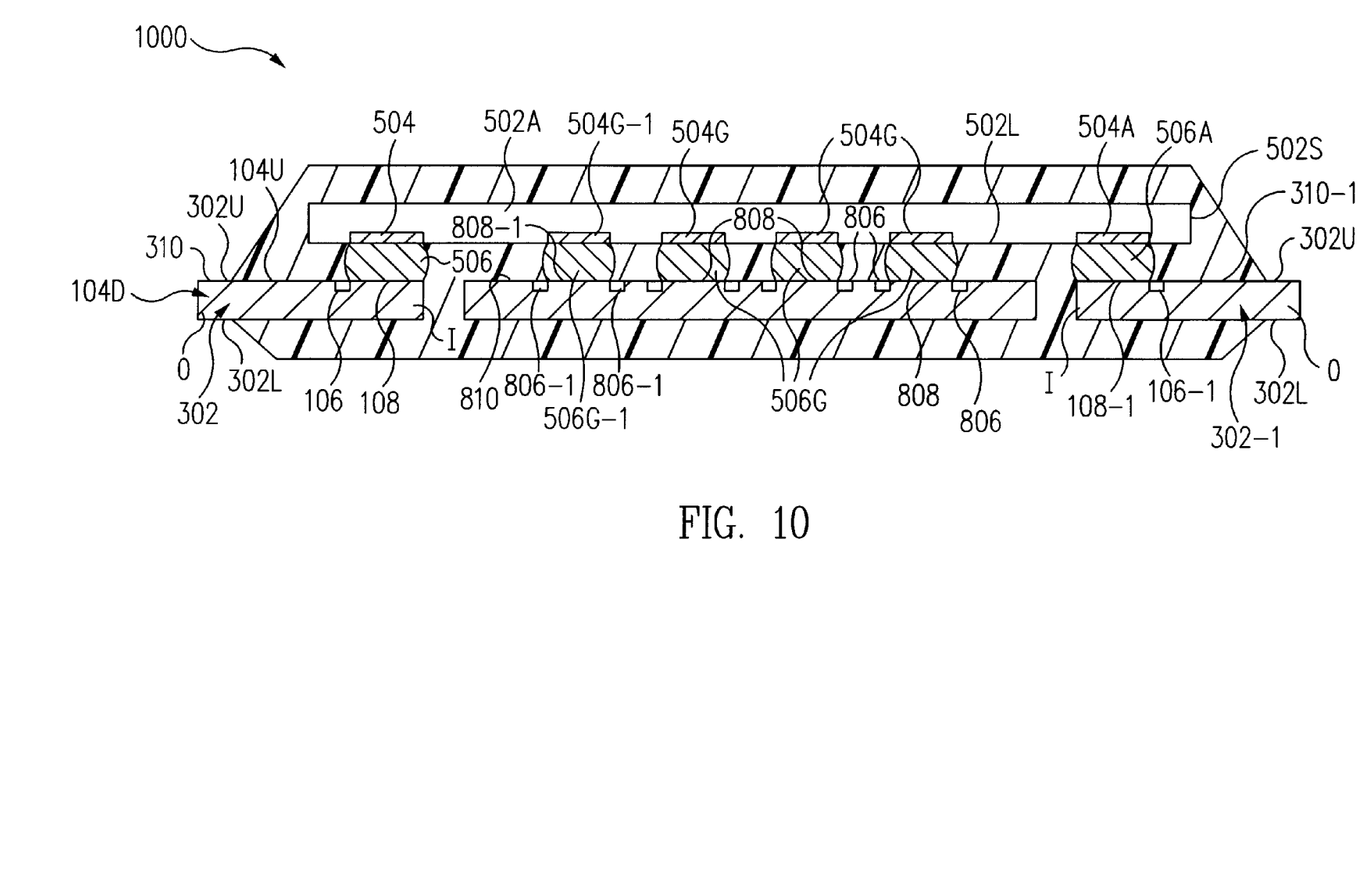
FIG. 10 is a cross-sectional view of a leadframe package formed with the leadframe of FIGS. 8 and 9A in accordance with one embodiment of the present invention.

FIG. 10 is a cross-sectional view of a leadframe package 1000 formed with leadframe 104D of FIGS. 8 and 9A in accordance with one embodiment of the present invention. Leadframe package 1000 of FIG. 10 is similar to leadframe package 500 of FIG. 5 and only the significant differences are discussed below.

Referring now to FIG. 10, leadframe package 1000 includes an electronic component 502A. Electronic component 502A includes bond pads 504 on lower surface 502L of electronic component 502A. Bond pads 504 are formed around a periphery of lower surface 502L adjacent a side 502S of electronic component 502A.

In addition, electronic component 502A further includes a plurality of redundant ground bond pads 504G inwards of bond pads 504. Redundant ground bond pads 504G are electrically and physically connected to wettable ground pads 808 of ground paddle 802 of leadframe 104D by redundant ground bumps 506G, e.g., formed of solder.

To illustrate, a first redundant ground bond pad 504G-1 of the plurality of redundant ground bond pads 504G is electrically and physically connected to wettable ground pad 808-1 by a first redundant ground bump 506G-1 of the plurality of redundant ground bumps 506G. The other redundant ground bond pads 504G are electrically and physically connected to the other wettable ground pads 808 by the other redundant ground bumps 506G in a similar manner and so are not discussed further to avoid detracting from the principals of the invention.

Advantageously, non wettable barriers 806 prevent redundant ground bumps 506G from running on to wettable ground paddle surface 810. Stated another way, non wettable barriers 806 insure that redundant ground bumps 506G only contact wettable ground pads 808. In this manner, redundant ground bumps 506G are formed with a repeatable height and formation of an open circuit between ground paddle 802 and redundant ground bond pads 504G is prevented.

Advantageously, ground paddle 802 serves at least two functions. First, ground paddle 802 allows redundant ground bond pads 504G to be electrically connected to a common conductor, e.g., held at a reference voltage such as ground. Further, ground paddle 802 functions as a heat sink to conduct heat from electronic component 502A and to dissipate this heat to the ambient environment.

Although leadframe package 1000 is illustrated and discussed above as being formed with leadframe 104D, in an alternative embodiment, a similar leadframe package is fabricated with leadframe 104E of FIG. 9B.

Figure 11:
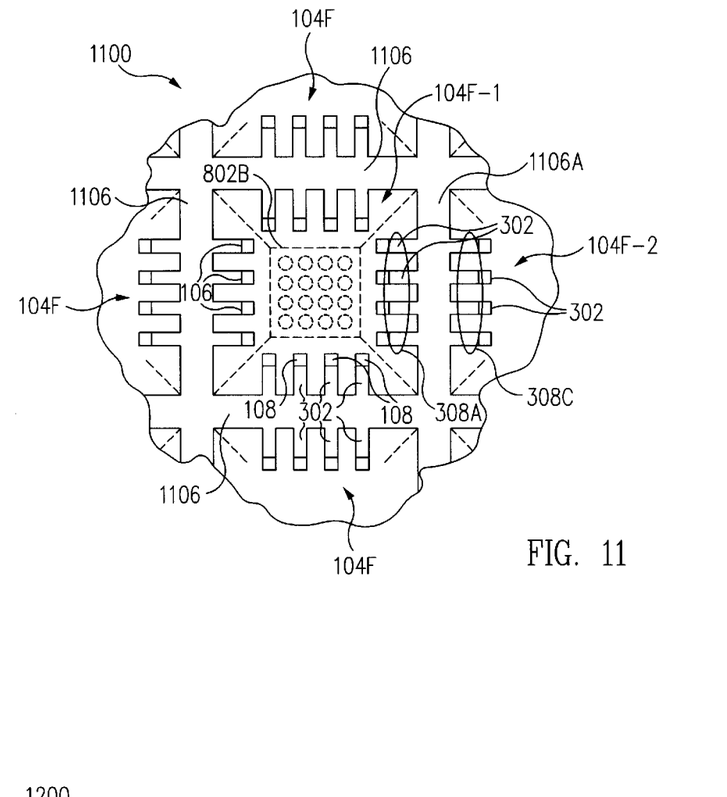
FIG. 11 is a top plan view of an array leadframe in accordance with an alternative embodiment of the present invention.

FIG. 11 is a top plan view of an array leadframe 1100 in accordance with an alternative embodiment of the present invention. Array leadframe 1100 includes a plurality of leadframes 104F integrally connected together by tiebars 1106. More particularly, each tiebar 1106 supports sets 308 of leads 302 of adjacent leadframes 104F opposite one another.

To illustrate, a first tiebar 1106A of the plurality of tiebars 1106 supports a set 308A of leads 302 of a first leadframe 104F-1 of the plurality of leadframes 104F of array leadframe 1100. Tiebar 1106A also supports a set 308C of leads 302 of a second leadframe 104F-2 of the plurality of leadframes 104F of array leadframe 1100. Set 308A of leads 302 is directly opposite set 308C of leads 302. The other tiebars 1106 support the other sets 308 of leads 302 in a similar manner and so are not discussed further to avoid detracting from the principals of the invention.

In accordance with various embodiments of the present invention, leadframes 104F of array leadframe 1100 of FIG. 11 are similar to leadframe 104B of FIG. 3 or leadframe 104C of FIG. 4B and so are not discussed further to avoid detracting from the principals of the invention.

In yet other alternative embodiments, leadframes 104F of array leadframe 1100 of FIG. 11 are similar to leadframe 104D of FIG. 8 or leadframe 104E of FIG. 9B. In accordance with these alternative embodiments, leadframes 104F include ground paddles 802B, which are indicated in dashed lines to avoid detracting from the principals of the invention.

Figure 12:
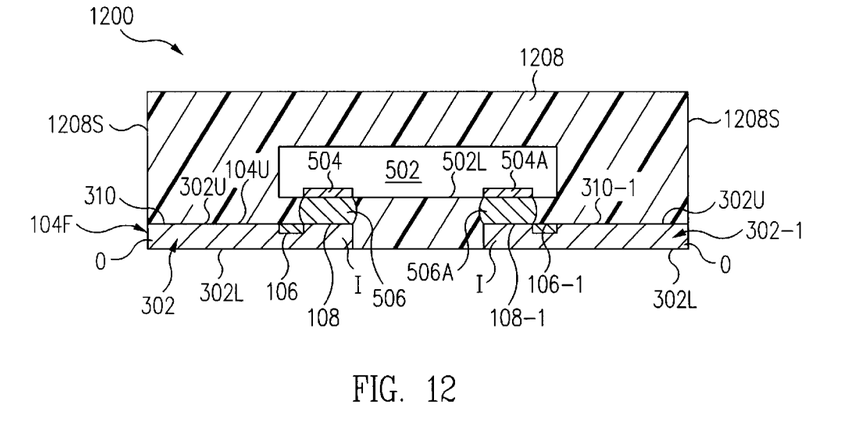
FIG. 12 is a cross-sectional view of a leadframe package formed with the array leadframe of FIG. 11 in accordance with one embodiment of the present invention.

FIG. 12 is a cross-sectional view of a leadframe package 1200 formed with array leadframe 1100 of FIG. 11 in accordance with one embodiment of the present invention. Leadframe package 1200 includes electronic component 502.

Referring now to FIG. 12, bond pads 504 of electronic component 502 are electrically and physically connected to wettable pads 108 of leads 302 by bumps 506.

Leadframe package 1200 further includes a package body 1208, e.g., encapsulant. Package body 1208 encloses electronic component 502, bumps 506, and upper surfaces 302U of leads 302 including wettable pads 108. At least portions of lower surfaces 302L of leads 302 are uncovered by package body 1208 and are thus exposed.

Leadframe package 1200 is fabricated in an array simultaneously with a plurality of leadframe packages 1200 from array leadframe 1100 of FIG. 11 in a manner similar to that described above with regards to the block diagram of FIG. 6. However, during singulation of array leadframe 1100, tiebars 1106 are cutaway or otherwise entirely removed. This results in outer ends O of leads 302 being coplanar with side 1208S of package body 1208.

This application is related to Greenwood et al., and commonly assigned U.S. patent application Ser. No. 09/929,428, entitled "LASER DEFINED PADS FOR FLIP CHIP ON LEADFRAME PACKAGE FABRICATION METHOD", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A leadframe comprising:
   a lead comprising:
      a wettable pad;
      a wettable lead surface;
      a non wettable barrier separating said wettable pad from said wettable lead surface;
      a non wettable layer; and
      a wettable layer coupled to said non wettable layer, a barrier region of said non wettable layer being exposed, said barrier region forming said non wettable barrier.

2. The leadframe of claim 1 wherein said barrier region separates a tip region of said wettable layer from a remainder region of said wettable layer.

3. The leadframe of claim 2 wherein said tip region forms said wettable pad.

4. The leadframe of claim 2 wherein said remainder region forms said wettable lead surface.

5. The leadframe of claim 1 wherein said non wettable layer comprises nickel.

6. The leadframe of claim 5 wherein said wettable layer is selected from the group consisting of palladium and gold.

7. The leadframe of claim 1 further comprising a ground paddle comprising:
   a wettable ground pad;
   a wettable ground paddle surface; and
   a non wettable ground pad barrier separating said wettable ground pad from said wettable ground paddle surface.

8. The leadframe of claim 7 further comprising tiebars, said ground paddle and said lead being coupled to said tiebars.

9. The leadframe of claim 7 wherein said non wettable ground pad barrier comprises a modified portion of said ground paddle.

10. A leadframe comprising:
    a tiebar; and
    leads integrally coupled to one another by said tiebar, said leads comprising:
       non wettable barriers comprising nickel;
       wettable pads defined by said non wettable barriers, said wettable pads being selected from the group consisting of palladium and gold;
       wettable lead surfaces, wherein said non wettable barriers separate said wettable lead surfaces from said wettable pads;
       a non wettable layer; and
       a wettable layer coupled to said non wettable layer, barrier regions of said non wettable layer being exposed, said barrier regions forming said non wettable barriers.

11. The leadframe of claim 10 further comprising a ground paddle integrally coupled to said tiebar, said ground paddle comprising:
    non wettable ground pad barriers comprising nickel; and
    wettable ground pads defined by said non wettable ground pad barriers, said wettable ground pads being selected from the group consisting of palladium and gold.

12. A package comprising:
    a leadframe comprising a lead comprising:
       a wettable pad;
       a wettable lead surface;
       a non wettable barrier separating said wettable pad from said wettable lead surface;
       a non wettable layer; and
       a wettable layer coupled to said non wettable layer, a barrier region of said non wettable layer being exposed, said barrier region forming said non wettable barrier;

an electronic component comprising a first bond pad; and a first bump electrically and physically coupling said first bond pad to said wettable pad.

13. The package of claim 12 wherein said first bump comprises solder.

14. The package of claim 12 wherein said non wettable barrier prevents said first bump from running on to and contacting said wettable lead surface.

15. The package of claim 12 further comprising a package body enclosing said electronic component, said first bump, and an inner end of said lead.

16. The package of claim 12 wherein said leadframe further comprises a ground paddle comprising:

a wettable ground pad;

a wettable ground paddle surface; and a non wettable ground pad barrier separating said wettable ground pad from said wettable ground paddle surface.

17. The package of claim 16 wherein said electronic component further comprises a second bond pad, said package further comprising a second bump electrically and physically coupling said second bond pad to said wettable ground pad.

18. The package of claim 17 wherein said non wettable ground pad barrier prevents said second bump from running on to and contacting said wettable ground paddle surface.

19. A package comprising:

a leadframe comprising a lead comprising:

a wettable pad;

a wettable lead surface;

a means for separating said wettable pad from said wettable lead surface;

a non wettable layer; and a wettable layer coupled to said non wettable layer, a barrier region of said non wettable layer being exposed, said barrier region comprising said means for separating said wettable pad from said wettable lead surface;

an electronic component comprising a first bond pad; and a means for electrically and physically coupling said first bond pad to said wettable pad.

20. The package of claim 19 wherein said means for separating prevents said means for electrically and physically coupling said first bond pad to said wettable pad from running on to and contacting said wettable lead surface.

21. The package of claim 19 wherein said leadframe further comprises a ground paddle comprising:

a wettable ground pad;

a wettable ground paddle surface; and a means for separating said wettable ground pad from said wettable ground paddle surface.

\* \* \* \* \*